United States Patent [19]
Fukui et al.

[11] Patent Number: 5,434,748
[45] Date of Patent: Jul. 18, 1995

[54] HERMETIC ELECTRONIC EQUIPMENT WITH FLEXIBLE DIAPHRAGM, FASTENED TO CASE BY ELASTIC U-SHAPED RING, FOR ABSORBING PRESSURE FLUCTUATIONS

[75] Inventors: Wataru Fukui; Hideki Umemoto; Yutaka Ohashi; Haruyuki Matsuo, all of Himeji, Japan

[73] Assignee: Mitsubishi Denki Kabushiki Kaisha, Tokyo, Japan

[21] Appl. No.: 277,305

[22] Filed: Jul. 22, 1994

Related U.S. Application Data

[63] Continuation of Ser. No. 124,857, Sep. 22, 1993, abandoned, which is a continuation of Ser. No. 889,432, May 28, 1992, abandoned.

[30] Foreign Application Priority Data

May 29, 1991 [JP] Japan .............................. 3-038586 U

[51] Int. Cl.6 .............................................. H05K 05/06
[52] U.S. Cl. ............................ 361/757; 361/739; 174/52.3; 220/721; 277/207 R
[58] Field of Search .............. 277/207 R, 210, 212 C; 439/271, 276; 220/720, 721; 200/302.1, 306; 174/17 VA, 50, 50.5, 52.1, 52.3; 361/600, 605, 622, 641, 728, 730, 736, 737, 739, 752, 757

[56] References Cited

U.S. PATENT DOCUMENTS

| | | | |
|---|---|---|---|
| 4,145,588 | 3/1979 | Orcutt | 200/302.1 X |
| 4,460,102 | 7/1984 | Barringer | 220/721 |
| 4,474,215 | 10/1984 | Richter et al. | 277/186 X |
| 4,890,764 | 1/1990 | Rossini | 220/721 X |
| 5,001,316 | 3/1991 | Salaman | 200/303 X |

FOREIGN PATENT DOCUMENTS

| | | |
|---|---|---|
| 3107694 | 9/1982 | Germany . |
| 3248715 | 7/1984 | Germany . |
| 3436300 | 5/1985 | Germany . |
| 1580599 | 7/1990 | U.S.S.R. ............................... 361/730 |

OTHER PUBLICATIONS

German Office Action, File No. P 42 17 837.1-34, dated Apr. 23, 1993 with English Translation.
IBM Technical Disclosure Bulletin, "Chip Joining Both Sides of Substrates Simultaneously", C. T. Rogers, vol. 13, No. 2, p. 396, Jul., 1970.

*Primary Examiner*—Michael W. Phillips
*Attorney, Agent, or Firm*—Sughrue, Mion, Zinn, Macpeak and Seas

[57] ABSTRACT

An electronic circuit equipment including a substantially box-shaped case main body (10) for defining a sealed interior space therein and an electronic circuit board (11) having a plurality of electronic components (12) thereon. The case main body (10) comprises a case body (13) and a flat plate-shaped lid (17) positioned properly with respect to the case body (13) to seal the interior space. A vent hole (20) is formed in the bottom wall of the case body (13) for communicating the interior of the case body (13) with ambient atmosphere. A cover member is attached to the case body (13) to cover the vent hole hermetically. By using a cover member, the interior space of the case body (13) is sealed for protecting electronic components (12) on the electronic circuit board (11) from moisture and rainwater and, for absorbing a pressure fluctuation therein. A mounting flange extends from the case body and surrounds the vent hole. The cover member is a flexible diaphragm with a circumferential bulge. The flexible diaphragm is fastened to the mounting flange by a press-fit elastic U-shaped ring which presses the circumferential bulge against the mounting flange so as to form a hermetic seal.

5 Claims, 4 Drawing Sheets

HERMETIC ELECTRONIC EQUIPMENT WITH FLEXIBLE DIAPHRAGM, FASTENED TO CASE BY ELASTIC U-SHAPED RING, FOR ABSORBING PRESSURE FLUCTUATIONS

This is a continuation of application Ser. No. 08/124,857 filed Sep. 22, 1993, now abandoned, which is a Continuation of application Ser. No. 07/889,432, filed May 28, 1992, now abandoned.

BACKGROUND OF THE INVENTION

This invention relates to a hermetic case for mounting a circuit board and an electronic circuit apparatus using above hermetic case, for use, for example, in an automotive ignition timing control system of an internal combustion engine.

FIG. 8 illustrates one example of a conventional electronic circuit apparatus for use in an automotive ignition timing control system. In FIG. 8, reference numeral 1 designates an electronic circuit board having electronic components 1a thereon, 2 designates a case body including a case main body 2a mounting the circuit board 1 therein, 3 designates a channel formed in a surrounding edge of the case main body 2a, 4 designates a lid for covering the case main body 2a, 5 designates a folded edge at a surrounding edge of the lid 4, and 6 designates an epoxy resin filler filled between the folding part 5 and the channel 3.

In order to prevent moisture in the ambient atmosphere from causing any adverse effect on the electronic components 1a on the circuit board 1 within the case body 2, the ease main body 2a and the lid 4 are made of a plastic material and are hermetically sealed by the epoxy resin filler 6. Also, the circuit board 1 is securely attached to the plastic main body 2 by means of screws 7.

In the electronic circuit apparatus as described above, pressure within the sealed case 2 changes with the temperature of the ambient atmosphere changes, which can range from −40° C. to 120° C. As this pressure fluctuation occurs repeatedly, the case 2 composed of the case main body 2a and the lid 4 can to crack, and ambient moisture and rainwater can enter into the interior, of case 2 thereby damaging the electronic components.

Also, because of the repeated pressure fluctuation, the case body 2 and the electronic circuit board 1 are repeatedly deformed and bent. This causes the solder connections between the circuit board 1 and the electronic components 1a to be damaged.

SUMMARY OF THE INVENTION

Accordingly, one object of the present invention is to provide an electronic circuit apparatus free from the above-discussed problems of the conventional electronic circuit apparatus.

Another object of the present invention is to provide an electronic circuit apparatus in which the electronic components are protected from moisture, and the pressure fluctuation of the sealed inner space of the case body is absorbed.

A further object of the present invention is to provide an electronic circuit apparatus in which the case body is kept from bending and cracking.

A still further object of the present invention is to provide an electronic circuit apparatus in which the electronic circuit board is kept from flexure caused by the bending of the case body, and the solder connections of the electronic components thereon are not broken.

With the above objects in view, the electronic circuit apparatus of the present invention comprises a case body which defines therein a hermetically sealed space for mounting electronic components. The case body is provided with a vent hole and a moisture-impermeable flexible cover member, which may be a diaphragm, for protecting the electronic components from moisture and for absorbing pressure fluctuation.

By using the vent hole and the cover member, the pressure of the sealed inner space is kept constant. When the ambient temperature rises, the pressure of the sealed inner space start to increases. The diaphragm bends and the air in the space between the diaphragm and the cover comes out through the vent hole. The pressure inside the is kept case equal to the pressure outside the case. The case body is kept from cracking and the electronic circuit board never bends. Further, the diaphragm seals the vent hole hermetically, and moisture of the ambient atmosphere never enters the sealed inner space and never touches the electronic components.

BRIEF DESCRIPTION OF THE DRAWINGS

The present invention will become more readily apparent from the following detailed description of the preferred embodiments of the present invention, taken in conjunction with the accompanying drawings, in which.

DESCRIPTION OF THE PREFERRED EMBODIMENTS

Figure 1:
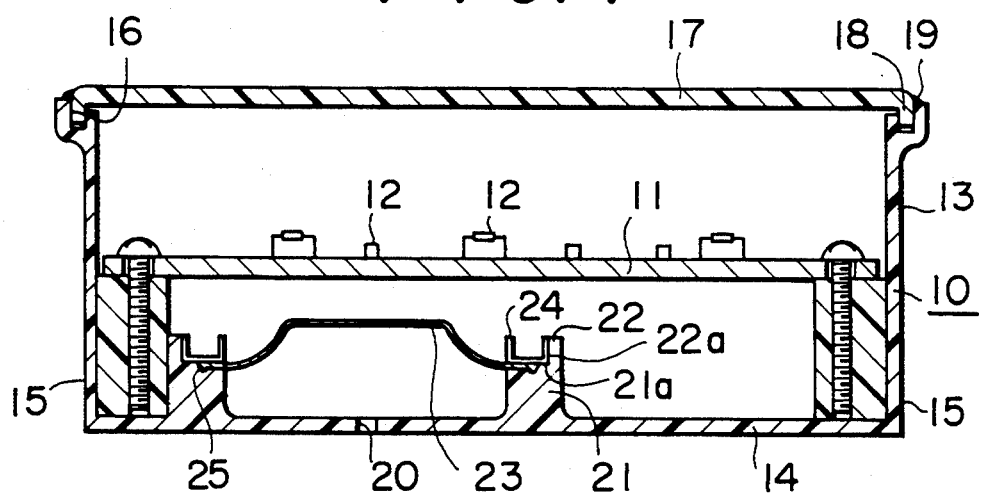
FIG. 1 is a longitudinal sectional view of an apparatus of the electronic circuit apparatus of the present invention.
Figure 2:
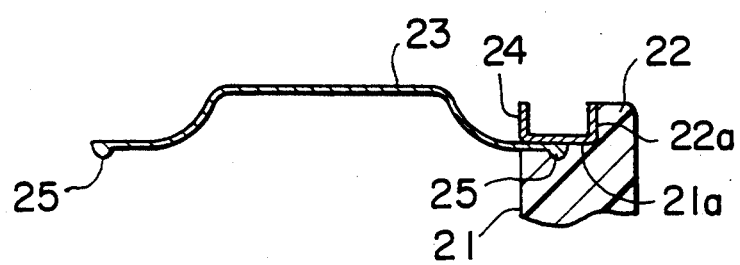
FIG. 2 is an enlarged fragmented sectional view of the cover means illustrated in FIG. 1.
Figure 3:
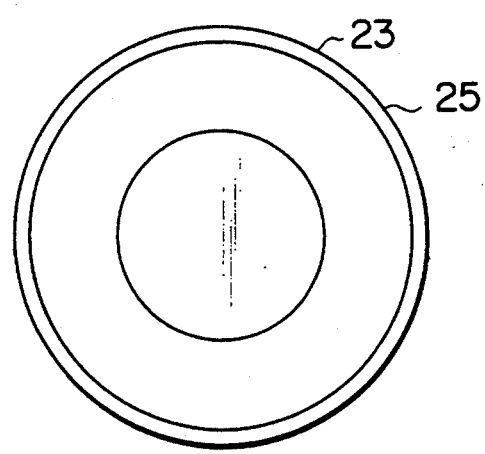
FIG. 3 is a top plan view of the diaphragm illustrated in FIG. 1.

FIG. 1 illustrates an electronic circuit apparatus of the present invention, which comprises a substantially box-shaped plastic case main body 10 defining an interior space therein, and an electronic circuit board 11 having a plurality of electronic components 12 thereon.

The case main body 10 comprises a case body 13 having a bottom wall 14 which defines a bottom major surface wall of the case main body 10 and side walls 15 extending upwardly from the bottom wall 14. The side walls 15 are provided at their top edges, which define an open end of the box, with channels 16 connected to each other to extend over the entire circumference. The case main body 10 also comprises a substantially flat plate-shaped lid 17 having a continuous folded edge 18 extending downwardly. The folded edge 18 is inserted into and engages the channel 16 formed in the case body 13, when it is placed on the case body 13 so that the lid 17 is properly positioned with respect to the case body 13. In order to hermetically seal the joint between the folded edge 18 and the channel 16, an epoxy resin filler 19 is filled in the channel 16.

The case body 13 further comprises a vent hole 20 formed in the bottom wall 14 of the case body 13 for communicating the interior space within the case main body 10 to the exterior of the case main body 10. The vent hole 20 is surrounded by an annular mounting flange or mounting bed 21 rising from the bottom wall 14 of the case body 13. The mounting bed 21 has a top end surface 21a, from which an annular riser wall 22 along the outer circumferential surface of the mounting bed 21 extends. The vent hole 20 is covered by a cover member such as a flexible diaphragm 23 attached to the top end surface 21a of the mounting bed 21. The diaphragm 23 is attached and sealed to the mounting bed 21 by means of suitable fastener such as a spring ring 24. Spring ring 24 has a U-shaped cross section and is elastically fitted against the top end surface 21a and an inner circumferential surface 22a of the annular riser wall 22 on the mounting bed 21. The diaphragm 23, the shape of which is substantially inverted dish-shaped, has a circumferential bulge 25 at its edge which is inserted into and sealingly contacted with the mounting bed 21 when the spring ring 24 is press-fit in place. Thus, the interior space of the case body 13 is hermetically sealed, thereby protecting the electronic components 12 from moisture and rainwater and absorbing the pressure fluctuation of the sealed space. Since electronic components 12 are mounted on one side of electronic circuit board 11 and diaphragm 23 faces the opposite side of electronic circuit board 11, diaphragm 23 will never come in contact with electronic components 12.

Figure 4:
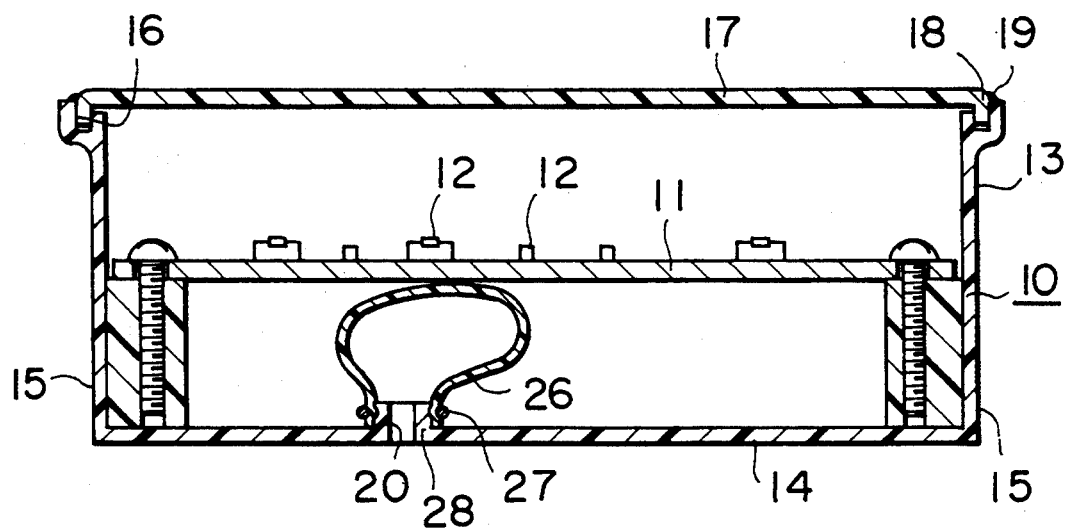
FIG. 4 is a longitudinal sectional view of another embodiment of the electronic circuit apparatus of the present invention.
Figure 5:
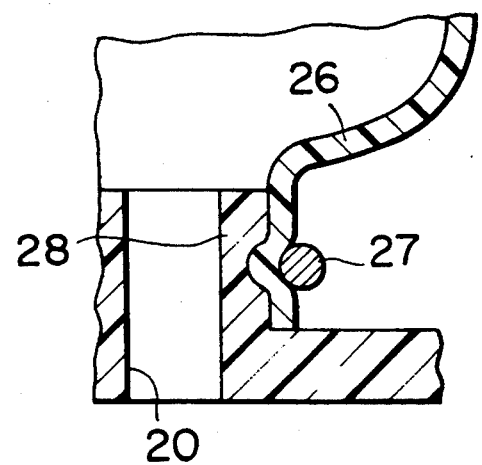
FIG. 5 is an enlarged fragmented sectional view of the cover means illustrated in FIG. 4.

FIG. 4 illustrates another embodiment of the electronic circuit apparatus of the present invention, which has basically the same structure as that illustrated in FIG. 1 but is different in one aspect. Such different structure is a cover member to cover a vent hole 20. The cover member comprises a balloon 26 attached and sealed to an annular mounting flange 28 which rises around the vent hole 20 from the bottom wall 14 of the case body 13 by means of suitable fastener such as an elastic spring ring 27, as illustrated the enlarged fragmented sectional view in FIG. 5. The shape of the cover member can vary widely.

Figure 6:
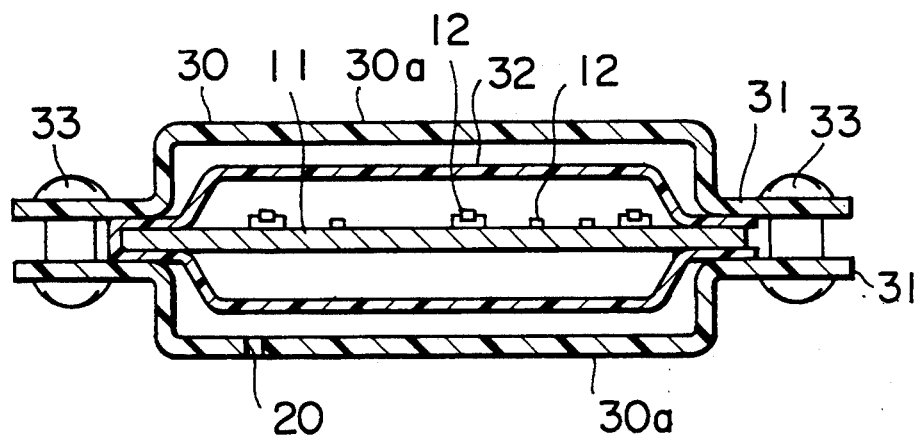
FIG. 6 is a longitudinal sectional view of still another embodiment of the electronic circuit apparatus of the present invention.

FIG. 6 illustrates still another embodiment of the electronic circuit apparatus of the present invention, which comprises a case body 30 composed of substantially flat box-shaped separate sections 30a provided at their surrounding open end with brim 31. A vent hole 20 is formed in one of separate sections 30a, and a cover member for covering an electronic circuit board 11 comprises a gas-impermeable flexible sheet 32. The flexible sheet 32 wrapping the electronic circuit board 11 is inserted between the separate sections 30a, and is clamped at the brims 31 by means of a suitable fastener such as screws 33 to seal the interior space of the flexible sheet 32. The case body itself does not need to be gas-impermeable and the assembling operation is easy.

Figure 7:
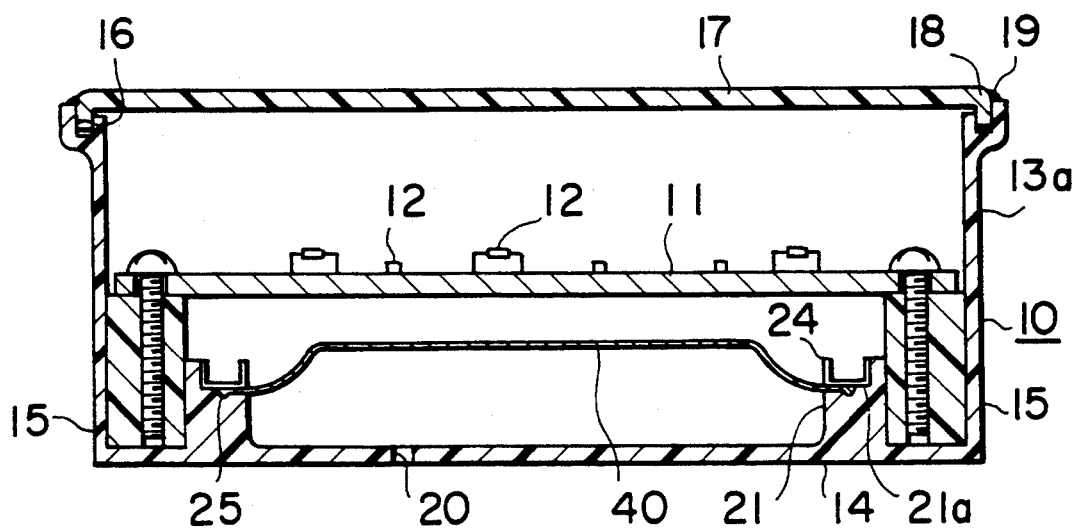
FIG. 7 is a longitudinal sectional view of still another embodiment of the electronic circuit apparatus of the present invention.
Figure 8:
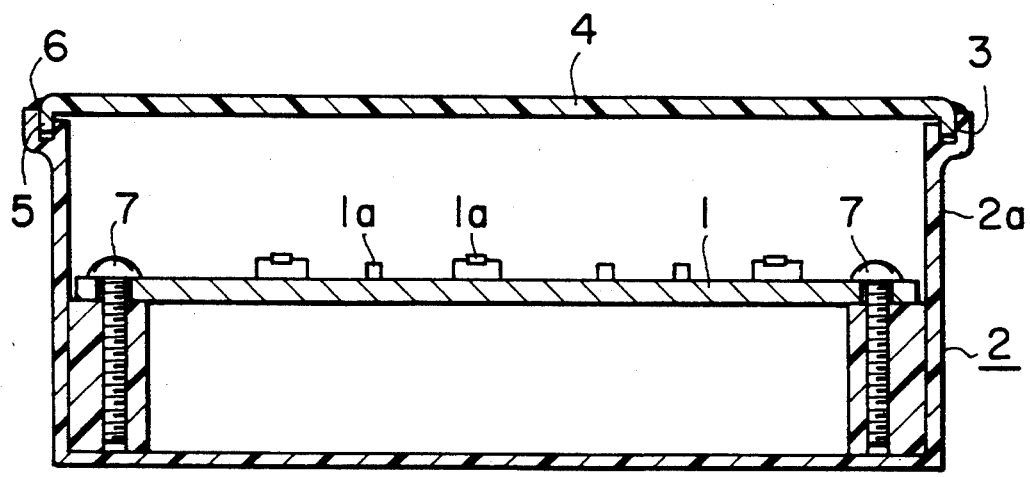
FIG. 8 is a longitudinal sectional view of a conventional electronic circuit apparatus.

FIG. 7 illustrates still another embodiment of the electronic circuit apparatus of the present invention, which has also basically the same structure as that illustrated in FIG. 1. A case body 13a comprises two major surface walls 14 and 17, and side walls 15 extending between the major surface walls 14 and 17. A vent hole 20 is formed in one of the major surface wall 14 and a cover member such as a substantially flat flexible diaphragm 40 is attached to the top end surface 21a of an annular mounting flange 21 which is rising from the major surface wall 14. A detailed fastening arrangement for attaching the flexible diaphragm 40 is, for example, the same way as described in the description of FIG. 1. The flexible diaphragm 40 extends substantially along and over the entire major surface wall 14. Since the area of the flexible diaphragm 40 is larger than that of the diaphragm 23 of FIG. 1, the flexible diaphragm 40 can be made more sensitive and attached at lower position, while the same volume needed for absorbing a pressure fluctuation in the sealed space of the case body 13a is maintained. The case body 13a can be miniaturized.

As above-mentioned, the electronic circuit apparatus of the present invention is watertight and, of course, can be used in an ignition timing control system of an outboard motor of a boat.

What is claimed is:

1. A hermetic case for encasing an electronic circuit board having an electronic element thereon comprising:
   a case body defining a hermetically sealed space for encasing an electronic circuit board;
   a vent hole disposed in said case body communicating said sealed space with ambient atmosphere; and
   a freely flexible cover means, exclusively attached to said case body and not in contact with either the electronic circuit board or the electronic element, for protecting the electronic element from moisture and absorbing a pressure fluctuation of said sealed space to prevent flexure of the electronic circuit board, wherein said cover means comprises: a mounting flange extending from said case body and surrounding said vent hole; a flexible diaphragm sealingly attached to said case body around said vent hole having a circumferential bulge integrally formed at its edge sealingly contacting said mounting flange to seal said vent hole, said circumferential bulge being an outcropping of said flexible diaphragm; and fastening means pressing said circumferential bulge of said flexible diaphragm against said mounting flange to provide a hermetic seal therebetween, said fastening means comprising an elastic ring having a U-shaped cross section which is press-fit onto said mounting flange, wherein the electronic element is exclusively mounted on a first side of the electronic circuit board, and said cover means faces a second side of the electronic circuit board, opposite the first side, no other electronic elements being mounted on the second side of the electronic circuit board.

2. A hermetic case as claimed in claim 1, wherein said flexible diaphragm has said circumferential bulge if said flexible diaphragm is in a free uncompressed state.

3. An electronic circuit apparatus comprising:
   a case body defining a hermetically sealed space therein;
   a circuit board having an electronic element exclusively mounted on a first side of said electronic circuit board, said circuit board fixedly mounted to said case body in said sealed space;
   a vent hole disposed in said case main body communicating said sealed space with ambient atmosphere; and a freely flexible cover means, exclusively attached to said case body and not in contact with said electronic element, for protecting said electronic element from moisture and absorbing a pressure fluctuation of said sealed space to prevent flexure of said circuit board, wherein said cover means comprises: a mounting flange extending from said case body and surrounding said vent hole; a flexible diaphragm sealingly attached to said case body around said vent hole having a circumferential bulge integrally formed at its edge sealingly contacting said mounting flange to seal said vent hole said circumferential bulge being an outcropping of said flexible diaphragm; and fastening means pressing said circumferential bulge of said flexible diaphragm against said mounting flange to provide a hermetic seal therebetween, said fastening means comprising an elastic ring having a U-shaped cross section which is press-fit onto said mounting flange, said cover means facing a second side of said electronic circuit board, opposite said first side, no other electronic elements being mounted on the second side of the electronic circuit board.

4. An electronic circuit apparatus as claimed in claim 3, wherein
said flexible diaphragm has said circumferential bulge if said flexible diaphragm is in a free uncompressed state.

5. An electronic circuit equipment as claimed in claim 3, wherein said cover means are disposed inside of said case body.

* * * * *